United States Patent [19]

Mazur

[11] 4,155,037

[45] May 15, 1979

[54] DATA ACQUISITION AND DISPLAY DEVICE

[75] Inventor: Richard A. Mazur, Woodridge, Ill.

[73] Assignee: The Continental Group, Inc., New York, N.Y.

[21] Appl. No.: 804,510

[22] Filed: Jun. 8, 1977

[51] Int. Cl.² .................... G01R 1/00; H03R 13/02
[52] U.S. Cl. .......................... 324/111; 340/347 AD; 364/900
[58] Field of Search ............... 324/111, 121 R, 112, 324/102, 99 D, 77 R, 113; 364/487, 200 MS File, 900 MS File; 340/347 AD

[56] References Cited

U.S. PATENT DOCUMENTS

| 2,761,968 | 9/1956 | Kuder | 324/99 D |
| 3,662,380 | 5/1972 | Cargile | 324/112 |
| 3,836,851 | 9/1974 | Schumann | 324/112 |

Primary Examiner—Rudolph V. Rolinec
Assistant Examiner—Ernest F. Karlsen
Attorney, Agent, or Firm—Diller, Ramik & Wight

[57] ABSTRACT

A data acquisition and display device for acquiring and displaying the time history of the variations in an analog value includes digital circuitry which employs a staircase voltage generator operated at a first frequency to quantize a range of analog voltages which correspond to the expected variations in the analog value. When the staircase voltage equals an analog voltage corresponding to the instantaneous value of the analog value, a memory device is conditioned to receive data corresponding to the staircase value. The memory acquires the data at a second frequency selected by the operator to acquire a fixed number of data inputs over a selected time period for which the time history is desired, and the circuitry automatically terminates data acquisition when the fixed number of data inputs is acquired. The data is read out at a third frequency selected by the operator.

7 Claims, 5 Drawing Figures

DATA ACQUISITION AND DISPLAY DEVICE

BACKGROUND OF THE INVENTION

This invention relates to a system of acquiring and displaying information corresponding to the time history of a variable analog value.

The Emschermann et al U.S. Pat. No. 3,880,007 discloses a temperature-sensitive unit operative for generating an analog temperature indicating electrical signals and is adapted to operate in very high temperature environments. As is disclosed in the aforementioned patent, a number of techniques have been employed in the prior art to obtain temperature readings in a high temperature environment. As noted, for registering apparatus which is electro-mechanical, its energy consumption can be very high and may serve to cause very fast temperature build-ups inside heat-insulating container. It is also known to position the recording instrumentality externally of the hostile environment and to connect same to the temperature-sensitive element by means of lengthy wires. Further, it is also known to provide a radio transmitter to transmit a temperature-indicating radio signal and to recover same externally of the hostile environment and, finally, it is also known to link the temperature-sensitive element and the remotely located measuring and recording equipment by optical means.

The aforesaid patent discloses a system in which the output of a binary counter is connected to a plurality of constant current sources, the current sources preferably being capable of supplying increasing current to the reference resistor.

When the voltage drop across the reference resistor is less than that across the temperature-sensitive resistor, the binary counter may be clocked to bring the two voltage drops into coincidence. In one embodiment, illustrated in FIG. 3, a binary store accepts successive values of the binary counter count which represent temperatures higher than the reference temperature.

BRIEF SUMMARY OF THE INVENTION

The present invention is concerned with the acquisition of data at a selected and predetermined rate and the accumulation thereof in a finite number of steps whereby the time history of the analog signal is recorded at specific times within an overall cycle time which may be adjusted as to its length under the control of the operator. The system combines an acquisition and a display mode again under the control of the operator by simply moving a switch from one position to another and the system incorporates a momentarily actuated start switch which starts either the acquisition or display mode as determined by the operation of the first mentioned switch. Internally of the circuitry, a staircase generator repetitively generates a voltage staircase at a first frequency and when the value of the staircase voltage equals the value of the analog input, a signal is produced which conditions a memory device to accept a digital count corresponding to the equality value of the staircase voltage. The counting circuit which drives the staircase voltage generator is used as a clock input to a further counter having plural output stages and a switch, selectively connected to one of these output stages is employed to produce, at a second frequency, a clocking input to an address counter for the memory device. In this way, the selector switch selects the data acquisition rate which is of a frequency much slower than the first mentioned frequency. The aforementioned counter which is clocked by the counter controlling the staircase voltage generator includes a second switch selectively connected to one of its output stages for clocking the address counter during the display mode and this can be at a selected frequency which is different from the other two previously mentioned.

Output stages of the address counter are utilized to terminate the acquisition cycle to reset and hold the first two counters in such reset condition, thereby terminating the data acquisition and placing the unit in a "hold" mode preparatory to placing the unit in the "display" mode. A start switch is utilized to reset not only the first two mentioned counters but also the address counter whereby the start switch initiates either the data acquisition mode or the display mode.

BRIEF DESCRIPTION OF THE DRAWING FIGURES

DETAILED DESCRIPTION OF THE INVENTION

Figure 1:
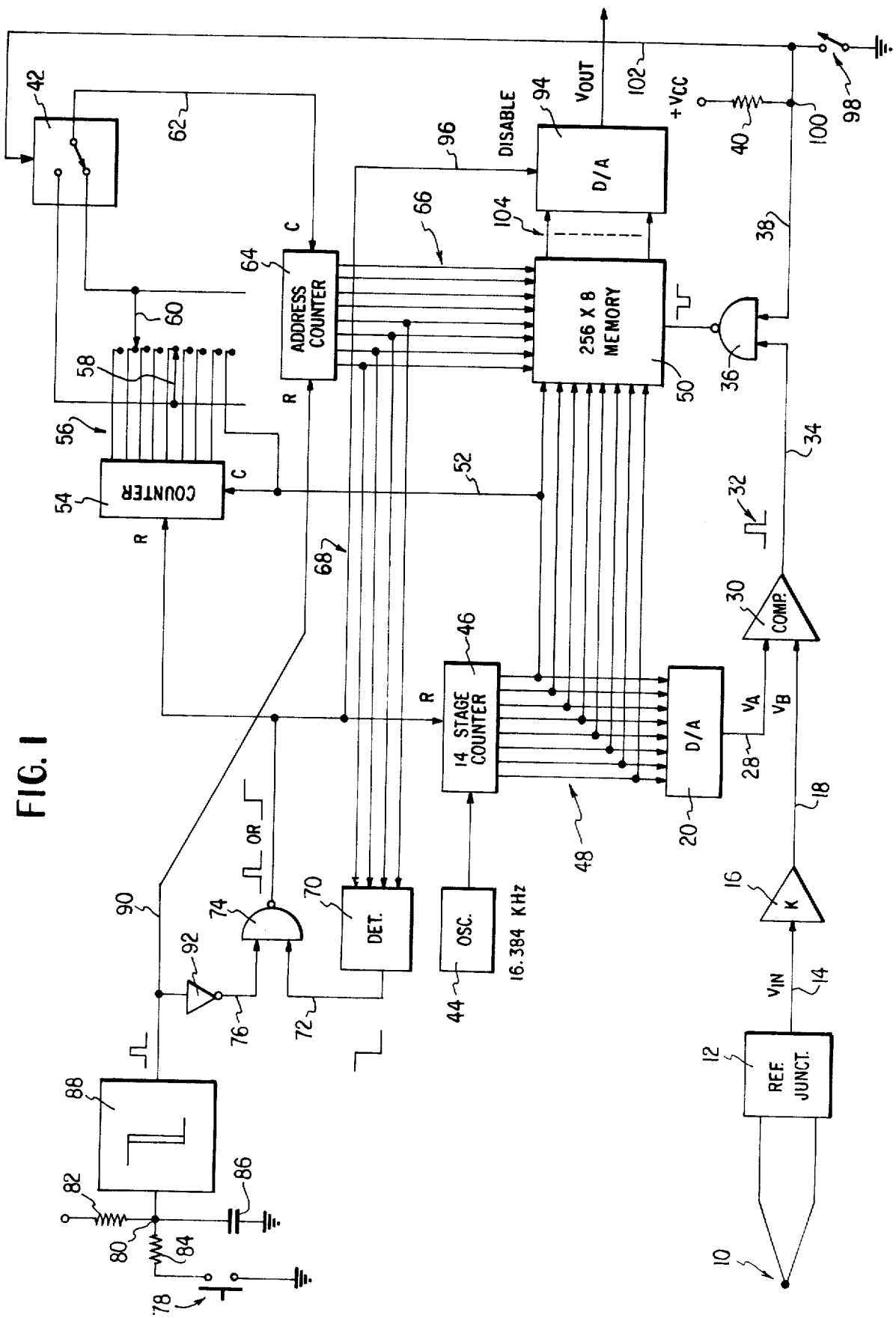
FIG. 1 is a circuit schematic illustrating an embodiment of the invention.

With reference at this time to FIG. 1, the reference character 10 indicates a thermocouple device which forms part of the voltage generating means producing an analog voltage output corresponding to instantaneous values of a variable analog value which is being measured. In this particular case, the analog value being measured is temperature and the leads of the thermocouple 10 are connected to a conventional reference junction 12 whose output 14 is connected to a suitable amplifier 16 which in turn produces the analog voltage output $V_B$ at its output 18. Normally, the voltage output at 18 is adjusted relative to reference voltage, in this case zero volts, such that the total spread between the reference potential and the maximum potential represented by $V_B$ allows proper quantizing by the staircase voltage generator 20.

Figure 2:
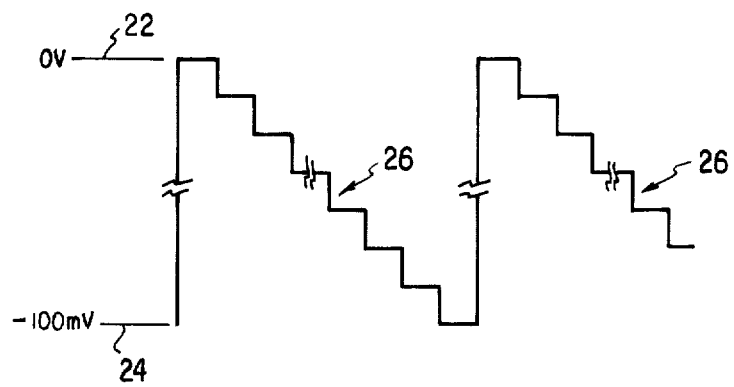
FIG. 2 is a waveform illustrating the staircase voltage generated.

This is more evident from FIG. 2 wherein the reference voltage line 22, corresponding to zero volts, and the line 24 which is −100 millivolts represents the bottom of the staircase 26 generated by the mechanism 20. In this specific instance, zero voltage output at $V_B$ may correspond to 0° F. whereas −100 millivolts corresponds to 500° F. with there being 256 steps in each staircase 26. Correspondingly, the temperature is quantized in steps of approximately 2° F.

The staircase generator 20 takes the form of a digital-to-analog converter having the analog voltage output $V_A$ at its output 28 which varies in staircase fashion as indicated in FIG. 2 in accord with the count input to the device 20. When the two voltages $V_A$ and $V_B$ are equal, the comparator 30 to which these voltages are connected produces an output pulse as indicated at 32 at its output connector 34 and this signal is applied as one input to the NAND gate 36 as illustrated. In the normal condition of the circuitry as is illustrated in FIG. 1, the other input 38 to the NAND gate 36 is high, thus enabling the gate. This high signal is produced by the connection from supply voltage $V_{CC}$ through the resistor 40 as illustrated and this high signal also conditions the electronic switch 42 to the position shown, the purpose of which will be hereinafter described.

The staircase voltage of FIG. 2 is generated by the device 20 in response to count inputs thereto generated by the combination of the clock or oscillator 44 and the counter 46 which is clocked by the oscillator as is illustrated. In the particular embodiment being described, the counter 46 is an eleven stage counter in which its fourth through eleventh output stages as indicated generally by the reference character 48 are connected as inputs to the converter 20. The oscillator 44 operates at a stable frequency of 16.384kHz whereby the converter 20 produces the aforementioned 256 steps every eighth of a second to produce the repetitive staircase waveform illustrated in FIG. 2.

The output stages of the counter 46 are also applied as inputs to the 256×8 memory device 50 and the most significant bits as indicated at 52 is connected as the clock input to a second counter 54. In this embodiment the counter 54 has eight output stages indicated generally by the reference character 56 and associated therewith are two movable switch contacts 58 and 60. The switch contact 60 is normally connected, through the electronic switch 42, as the clock input at the line 62 to the address counter 64. As noted before, the most significant bit output of the counter 46 is connected as the clock input to the counter 52 and, therefore, this clock input is at a frequency of 8Hz so that the respective output stages 56 of the counter 54, counting from top to bottom, represent frequencies of 1/32, 1/16, $\frac{1}{8}$, $\frac{1}{4}$, $\frac{1}{2}$, 1, 2 and 4Hz. It will also be noted that the 8Hz clock input at 52 may also be contacted by either one of the switch contacts 58 or 60. Since, as will be described hereinafter, the address counter 64 is reset after producing 240 addresses, the total cycle time for acquisition of temperature readings may be regulated stepwise from the maximum time of 128 minutes to the minimum time of $\frac{1}{2}$ minute.

From the description thus far, it will be evident that whereas the converter 20 produces the staircase voltages at the rate of 8 cycles per second, the memory device 60 will store the counts of $V_A = V_B$ at a much slower rate, dependent upon the position of the switch contact 60.

The counter 64 is an eight stage counter and its eight output stages are applied to the memory 50 as indicated by the reference character 66 and the four most significant bits of these output stages 66 are applied, as indicated by the reference character 68 to the comparator or detector device 70 which detects when these four stages ae all one. Since this corresponds to the decimal count of 240, the detector 70 produces a low output at its conductor 72 when the 240th count is reached and this will cause reset of the two counters 46 and 54 as hereinafter described and will hold same reset thereby to terminate the acquisition cycle automatically. The signal at the conductor 72 is applied as one input to the NAND gate 74 and the other input 76 thereto normally is high except when the push button or other type of momentary switch 78 is actuated to closed position. The junction 80 is connected to the voltage supply through the resistor 82 and to the switch 78 through the resistor 84. Therefore, the capacitor 86 normally is charged except when the switch 78 is closed and the consequent voltage swing at the junction 80 causes the Schmidt trigger 88 to output a positive pulse as illustrated on the conductor 90. The conductor 90 is connected directly to the reset of the counter 64 and, through the inverter 92, is applied as the other input 76 to the NAND gate 74. Thus, the switch 78 is a start switch which, when depressed, resets the counters 46, 54 and 64 to start the acquisition cycle. Then, as has been explained above, when the total cycle time has been completed and there are 240 digital temperature values stored in the memory 50, the detector 70 produces the negative level on the conductor 72 causing the output of the NAND gate 74 to go high which resets the two counters 46 and 54 and holds them in this condition thereby preventing further acquisition of data. This reset action also disables the digital-to-analog converter 94 by the high signal at the conductor 96, the purpose of which will be presently apparent.

Once the data has been acquired, the system automatically is placed in the "hold" mode as discussed above and, when desired, the acquired data may be read out by placing the system in the "display" mode. This is effected by closing the switch 98 which effects two operations. First of all, the signal at the junction 100 goes low thereby to disable the NAND gate 36 and, at the same time, this low signal as applied over the conductor 102 to the electronic switch 42 switches the switch 58 into connection with the conductor 62 for providing the clock inputs to the counter 64. The system is now prepared for the "display" mode and as soon as the switch 78 is momentarily depressed, the trigger circuit 88 produces an output pulse to reset the counter 64 which previously had been holding on the count of 240 and this immediately removes the low signal on the line 72 from the detector circuit 70, thereby removing the reset signal to the counters 1 and 2. At this point, the counter 46 resumes counting of the clock inputs thereto and the counter 54 resumes counting the most significant bit output of the counter 46 as previously described. Therefore, dependent upon the position at which the switch contact 58 is set, the counter 64 will be clocked at the corresponding rate as previously described to address the memory 50 to cause the addressed data to be read out of the memory circuit 50 over the output lines 104. The analog voltage output $V_{OUT}$ from the converter 94 appears at the conductor 106 and is applied to a suitable display or other type of device for recording the information.

Figure 4:
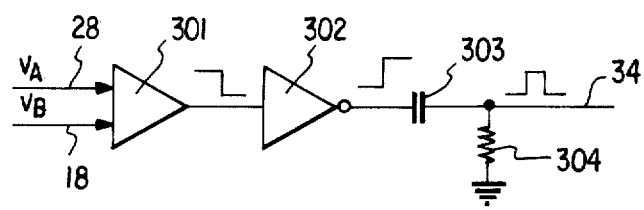
FIG. 4 is a detailed circuit diagram of the comparator 30 in FIG. 1.

FIG. 4 illustrates the circuit details of the comparator 30. As illustrated, the comparator 30 of FIG. 1 includes the integrated circuit 301 which produces an output signal as illustrated which goes low when $V_A = V_B$. That is to say, when the staircase generator reaches a number which is the equality level, the signal goes low and remains low until the staircase cycle begins again. This signal is applied to the inverter 302 which inverts the waveform as shown and the differentiating capacitor 303 and associated resistor 304 provide the positive going pulse as illustrated at the conductor 34 as previously described.

Figure 5:
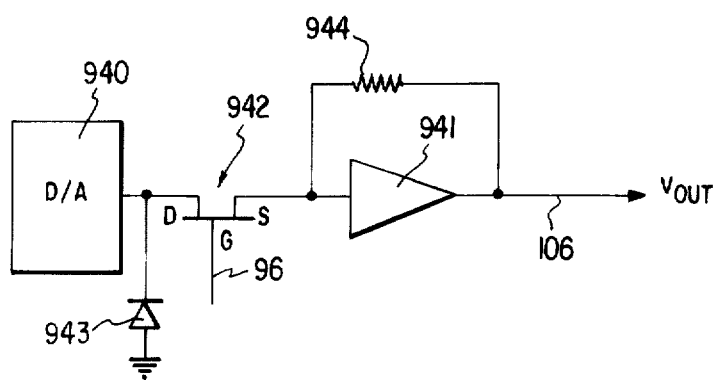
FIG. 5 is a detailed circuit diagram of the converter means 94 in FIG. 1.

FIG. 5 illustrates details of the digital-to-analog device 94 of FIG. 1. This device includes the integrated circuit 940 which receives the input information from the memory 50 and its output is coupled to the integrated circuit 941 through the FET device 942 whose gate electrode is connected to the conductor 96 previously described. The diode 943 is provided for protective purposes and the input and output of the integrated circuit 941 may be selectively coupled through the resistor 944 to adjust the recording equipment prior to a display cycle. That is to say, at the end of the acquisition mode, the signal at the conductor 96 is high, thus disabling the FET 942 until the display mode switch is actuated and the start switch 78 is reactuated. Prior to this time, the output conductor 106 may be coupled to the display device and the jumper 945 connected in the circuit to calibrate or zero the display device. In this respect, it is noted that in the embodiment described in conjunction with FIG. 1, $V_{OUT}$ should equal zero volts for 0° F. and 5 volts for 500° F.

In the embodiment of FIGS. 1, 4 and 5, the components illustrated are as follows:

54,64 — MC14520AL (Motorola)
46 — MC14020AL (Motorola)
20,94 — AD7520SD (Analog Devices)
42 — MM54C157J (National)
12 — JR339 (Consolidated Ohmic Devices)
50 (two chips) — MWS5040D (RCA)
70 (NAND gate) — MC14012AL (Motorola)
44 — CD4047AD (RCA)
16 — OP-07AJ (Precision Monolythics)
88 — MC14093BAL (Motorola)
301 — SSS725AJ (Precision Monolythics)
302 — MC14093BAL (Motorola)
940 — MC1556G (Motorola)
941 — MC14520AL (Motorola)

Figure 3:
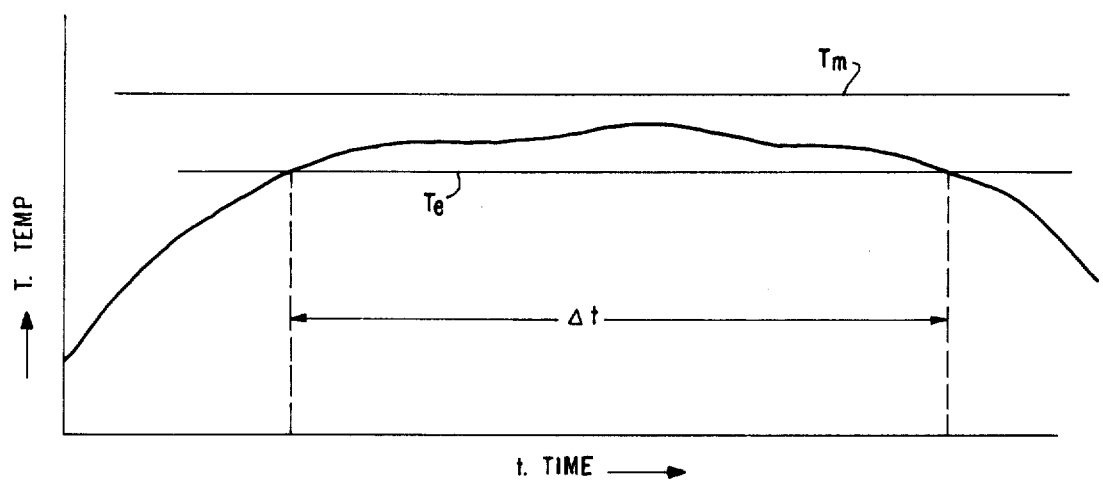
FIG. 3 is a recording of the time history in a typical utilization of the invention.

The thermocouple 10 is of the iron-constantan type and a typical display which may be provided by the device is illustrated in FIG. 3. In FIG. 3, $T_M$ represents the maximum temperature to which a can body should be subjected during a decorative resin curing cycle, $T_C$ represents the minimum curing temperature and $\Delta t$ is the time required to complete the curing cycle. The circuitry package of FIG. 1 is contained in an enclosure which resists high temperature and it may be attached to the pin of a typical pin oven adjacent to a can body located on the next adjacent pin, the can body having the thermocouple 10 attached thereto. The switch 60 of FIG. 1 is adjusted for the approximate time it takes the can body to pass completely through the pin oven, the switch 42 is in the data acquisition mode as illustrated in FIG. 1 and the start switch 78 is actuated as the can body starts its progress through the oven. When the can body and the circuitry container are retrieved at the other end of the oven, the device should be in the hold mode, having just completed its timing cycle for accumulation of the 240 temperature readings. The operator can then attach the output of the converter 94 to a suitable display device such as a recorder and, after zeroing as mentioned before, the switch 98 is closed to actuate the switch 42, the switch 58 being set at the desired read-out cycle time and the start switch 78 is again momentarily depressed to start the display cycle. FIG. 3 represents a typical display.

It will be appreciated that the sensing device 10 may take any form desired which is capable of converting a variable analog value into a corresponding analog voltage. It is also to be understood that a plurality of sensors 10 may be provided with their inputs being multiplexed, under control by the counter 46, for application to the comparator 30.

What is claimed is:

1. In a device for determining the time history of a variable analog value, the combination of:
   voltage generating means for producing an analog voltage output corresponding to the instantaneous value of the variable analog value;
   a digital-to-analog converter having a staircase voltage output;
   comparator means connected to the outputs of said voltage generating means and of said digital-to-analog converter for producing an output pulse when said outputs are equal;
   a first plural stage counter connected to said digital-to-analog converter;
   clock means for clocking said first counter repetitively to cycle through its count whereby said comparator means produces an output pulse once every cycle;
   a memory device connected to the output of said first counter and to the output pulses of said comparator means whereby said memory device is conditioned to accept the count of said first counter corresponding to the value of said staircase voltage which is equal to the output of said voltage generating means;
   a second counter connected to the most significant output bit of said first counter and having a plurality of output stages;
   control means selectively connected to an output stage of said second counter for causing said memory device periodically to acquire those counts corresponding to values of said staircase voltage which establish equality with said output of the voltage generating means; and
   detector means associated with said control means for terminating said acquisition thereby after a predetermined number of acquisitions whereby the total acquisition time is controlled by the particular output stage of said second counter to which said control means is connected.

2. In a device as defined in claim 1 wherein said control means comprises a plural stage address counter having a plurality of output stages connected to said memory device.

3. In a device as defined in claim 2 wherein said control means is connected to a plurality of the output stages of said address counter whereby to terminate the acquisition of data before said memory device is full.

4. In a device for determining the time history of a variable analog value, the combination of:
   voltage generating means for producing an analog voltage output corresponding to the instantaneous value of the variable analog value;
   comparator means having two inputs and receiving said analog voltage output as one input for producing a signal when said two inputs are equal;
   digital-to-analog converter means providing the other input to said comparator means, a first plural stage counter having its output stages connected to said converter means, and clock means strobing said first counter at a first selected frequency whereby equality of said two inputs is reached repetitively and at a second frequency which is less than said first frequency;
   memory means controlled by the count output of said first counter for acquiring counts of the latter corresponding to said equalities at a third frequency which is less than said second frequency, and including a second plural output stage counter and switch means selectively connected to a desired output stage of said second counter to control said third frequency;
   control means connected to said memory means for terminating data acquisition thereby after a predetermined number of periods of said third frequency;

second digital-to-analog converter means connected to said memory means for producing an analog output signal in accord with the data stored in said memory means; and further switch means selectively connected to a desired output stage of said second counter for applying the data stored in said memory means to said second converter means at a fourth frequency which may be different from said third frequency.

5. In a device as defined in claim 4 wherein said memory means includes an address counter, and including a first operator-controlled switch for clocking said address counter selectively at said third and fourth frequencies.

6. In a device as defined in claim 5 wherein said control means resets said first and second counters.

7. In a device as defined in claim 6 including a second operator-controlled switch for resetting said first, second and address counters whereby to initiate either the acquisition of or reading out of said data.

* * * * *